US012610640B2

(12) United States Patent
Chung et al.

(10) Patent No.: US 12,610,640 B2
(45) Date of Patent: Apr. 21, 2026

(54) BACK-ILLUMINATED SENSOR AND METHOD OF MAKING SAME

(71) Applicant: KLA Corporation, Milpitas, CA (US)

(72) Inventors: Ting Fung Chung, Milpitas, CA (US); Sisir Yalamanchili, Fremont, CA (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 18/929,587

(22) Filed: Oct. 28, 2024

(65) Prior Publication Data

US 2025/0142992 A1     May 1, 2025

Related U.S. Application Data

(60) Provisional application No. 63/546,530, filed on Oct. 31, 2023.

(51) Int. Cl.
H10F 39/00     (2025.01)
H10F 39/12     (2025.01)

(52) U.S. Cl.
CPC ......... H10F 39/805 (2025.01); H10F 39/024 (2025.01); H10F 39/026 (2025.01); H10F 39/028 (2025.01); H10F 39/199 (2025.01)

(58) Field of Classification Search
CPC .... H10F 39/805; H10F 39/199; H10F 39/026; H10F 39/028; H10F 39/024
See application file for complete search history.

(56) References Cited

U.S. PATENT DOCUMENTS 9,496,425 B2 *  11/2016  Chern .................. G01N 21/956
9,748,294 B2 *  8/2017  Muramatsu ........... H10F 39/805
9,818,887 B2 *  11/2017  Chern ..................... H10F 77/30
10,121,914 B2 *  11/2018  Chern ................... H10F 39/024
10,269,842 B2 *  4/2019  Muramatsu ........... H10F 39/199
10,283,551 B2 *  5/2019  Muramatsu ......... H10F 39/8057
10,446,696 B2 *  10/2019  Chern ................... H10F 39/805
10,468,543 B2 *  11/2019  Wang ................. H10F 71/1212
11,114,489 B2 *  9/2021  Chuang ................. H10F 39/811
11,114,491 B2 *  9/2021  Chuang ................. H10F 39/024
11,848,350 B2 *  12/2023  Haddadi .............. H10F 39/026
2003/0094664 A1  5/2003  Yagi
2007/0007556 A1 *  1/2007  Shibayama ............. H10F 39/18
                                                    257/E31.118
2013/0264481 A1 *  10/2013  Chern ................ G01N 21/9501
                                                    257/432
2013/0320478 A1  12/2013  Jangjian et al.
2014/0291493 A1 *  10/2014  Chuang ................. H10F 77/306
                                                    257/431
2015/0028386 A1 *  1/2015  Shi ........................ H10F 77/413
                                                    438/72

(Continued)

OTHER PUBLICATIONS

WIPO, International Search Report and Written Opinion issued for PCT/US2024/053471, Feb. 12, 2025.

*Primary Examiner* — Mounir S Amer
*Assistant Examiner* — Alexander Belousov
(74) *Attorney, Agent, or Firm* — Hodgson Russ LLP

(57)     ABSTRACT

An image sensor includes a p-type silicon layer, a silicon layer disposed on the p-type silicon layer, a p-type SiGe layer disposed on the p-type silicon layer, a boron layer disposed on the p-type SiGe layer, and an anti-reflective coating disposed on the boron layer. A trench can be formed in the image sensor such that the boron layer is disposed in the trench.

20 Claims, 17 Drawing Sheets

(56)  References Cited

U.S. PATENT DOCUMENTS

| | | | |
|---|---|---|---|
| 2015/0200216 A1* | 7/2015 | Muramatsu | H10F 39/024 |
| | | | 438/72 |
| 2016/0290932 A1* | 10/2016 | Chern | G01N 21/8806 |
| 2017/0338257 A1* | 11/2017 | Muramatsu | H10F 39/024 |
| 2018/0047857 A1* | 2/2018 | Chern | H10F 39/024 |
| 2018/0286901 A1* | 10/2018 | Muramatsu | H10F 39/199 |
| 2019/0131465 A1* | 5/2019 | Chern | G01N 21/956 |
| 2019/0288132 A1* | 9/2019 | Wang | H10F 77/70 |
| 2019/0386054 A1* | 12/2019 | Chuang | H10F 39/805 |
| 2020/0194476 A1* | 6/2020 | Chuang | H10F 39/80 |
| 2021/0320144 A1* | 10/2021 | Haddadi | H10F 39/026 |
| 2022/0254829 A1* | 8/2022 | Yalamanchili | G03F 7/70033 |
| 2023/0378215 A1* | 11/2023 | Cheng | H10F 39/8053 |
| 2024/0063248 A1* | 2/2024 | Haddadi | H10F 39/199 |
| 2024/0243143 A1 | 7/2024 | Butaeva et al. | |
| 2024/0250110 A1* | 7/2024 | Haddadi | H10F 39/1538 |
| 2025/0072139 A1* | 2/2025 | Brown | H10F 39/80373 |
| 2025/0142992 A1* | 5/2025 | Chung | H10F 39/028 |

* cited by examiner

100

101

100

103

102

101

100

103

102

101

104

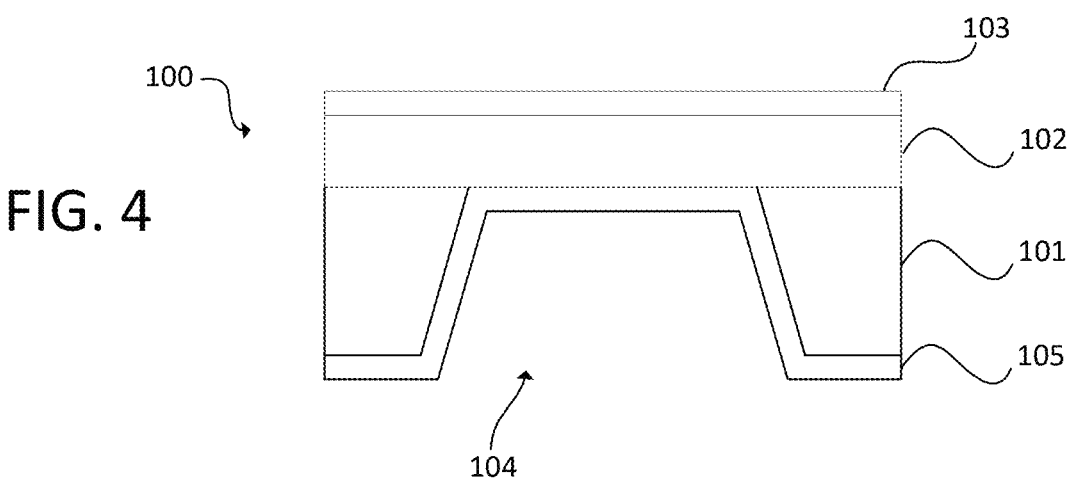
FIG. 4
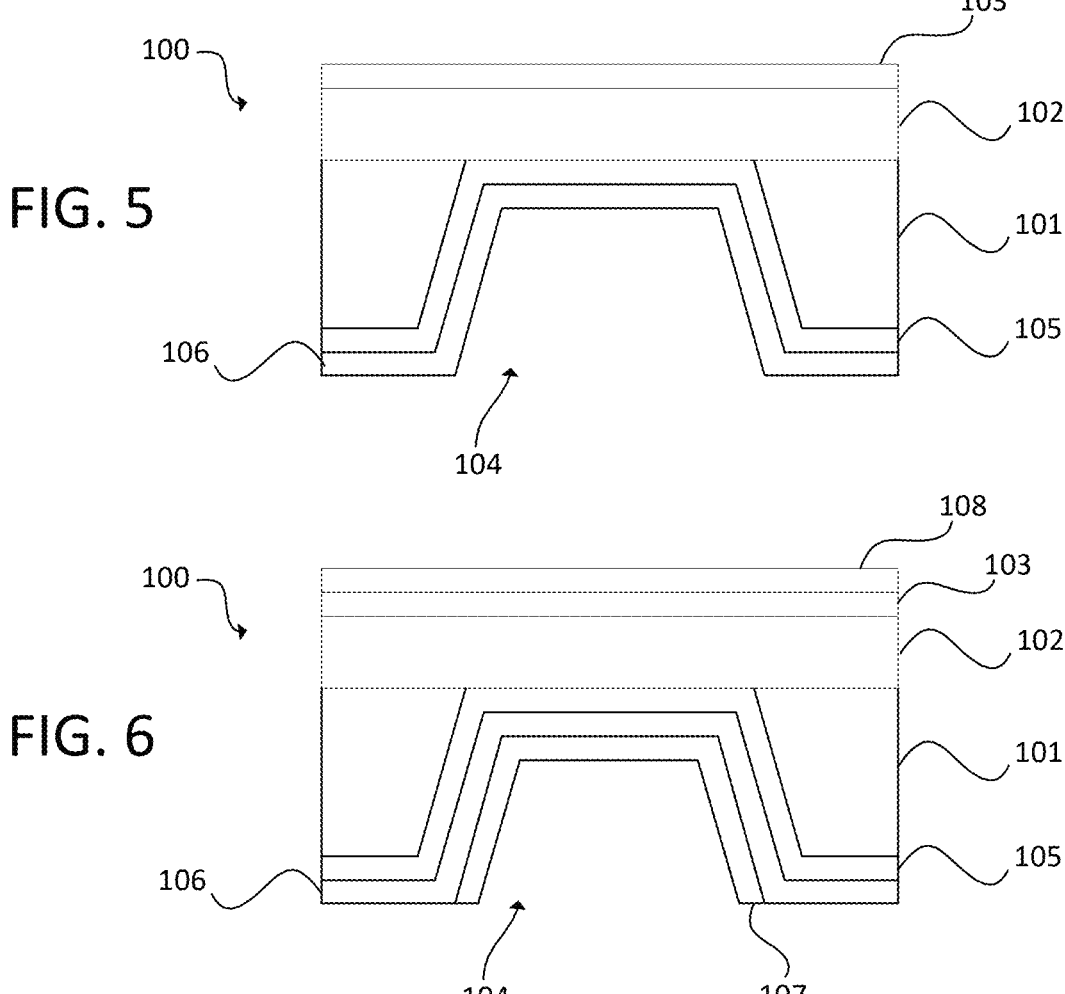
FIG. 5
FIG. 6

Interconnects

Front-end polySi & circuit element p⁻ Si epilayer p+ SiGe epilayer

Boron layer (optional) Anti-reflection layer

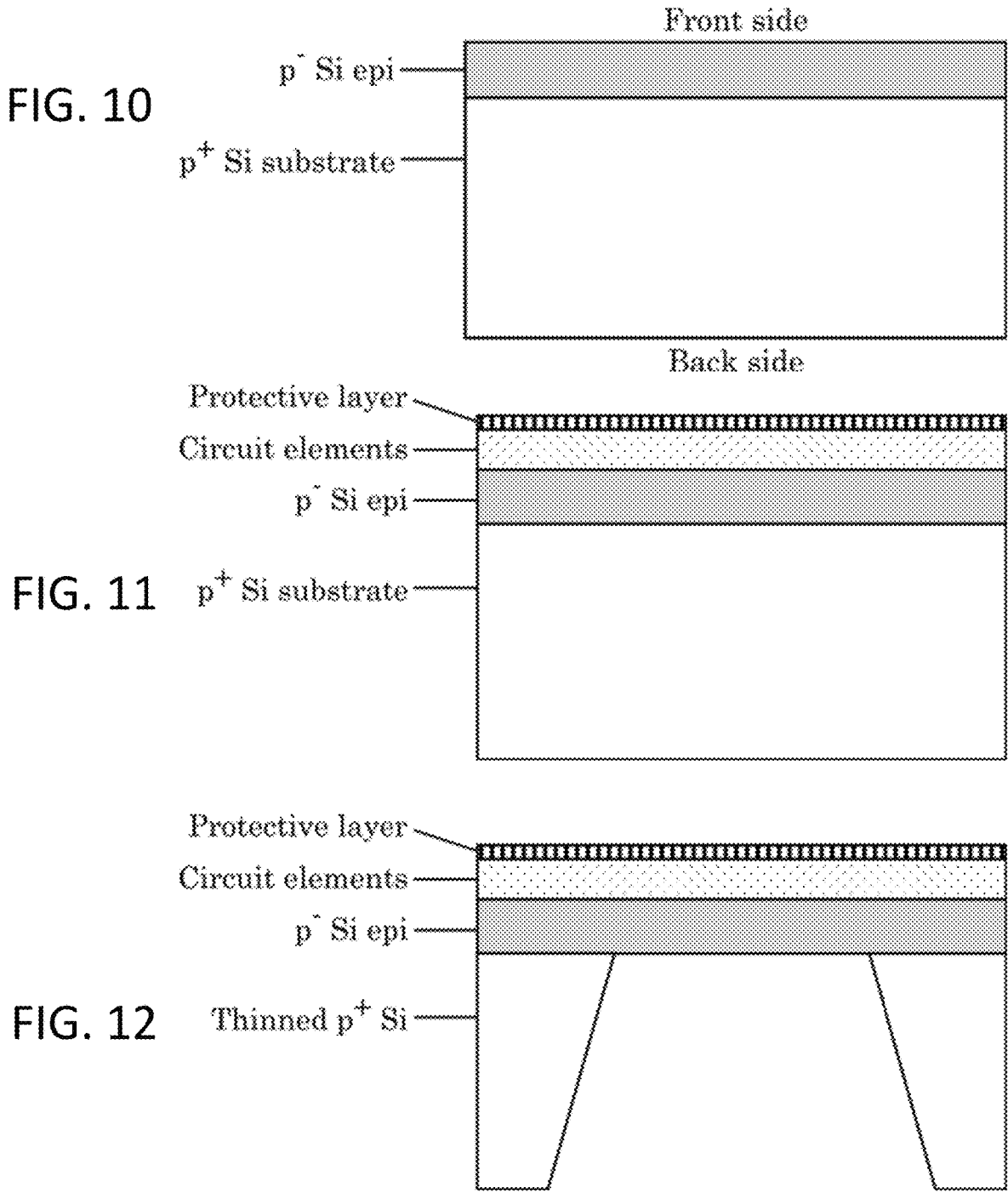

Protective layer
Circuit elements
p⁻ Si epi
Thinned p⁺ Si
p SiGe epi

Protective layer
Circuit elements
p⁻ Si epi
Thinned p⁺ Si
p+ SiGe epi
Pure boron layer Front side metal
Circuit elements
p⁻ Si epi
Thinned p⁺ Si
p+ SiGe epi
Pure boron layer Front side metal Circuit elements p⁻ Si epi Thinned p⁺ Si p+ SiGe epi Pure boron layer Capping layer p⁻ Si epi p⁺ Si substrate Blind vias Circuit elements { p⁻ Si epi p⁺ Si substrate

2ND Si handle substrate

Protective layer

Circuit elements { p⁻ Si epi p⁺ Si substrate

2$^{ND}$ Si handle substrate —

Protective layer —

Circuit elements { p$^-$ Si epi —

Etched p$^+$ Si —

2$^{ND}$ Si handle substrate —

Protective layer —

Circuit elements { p$^-$ Si epi — p$^+$ SiGe epi —

Etched p$^+$ Si —

2$^{ND}$ Si handle substrate —

Protective layer —

Circuit elements { p$^-$ Si epi — p$^+$ SiGe epi —

Pure boron layer —

2$^{ND}$ Si handle substrate

Protective layer

Circuit elements p$^-$ Si epi p$^+$ SiGe epi

Pure boron layer

Capping layer

Protective layer
Circuit elements
p⁻ Si epi
Top Si layer
Oxide layer
Si substrate Protective layer
Circuit elements
p⁻ Si epi
Top Si layer
Oxide layer
Si substrate
p⁺ SiGe epi Protective layer Circuit elements p⁻ Si epi Top Si layer Oxide layer Si substrate p⁺ SiGe epi Pure boron layer Protective layer Circuit elements p⁻ Si epi Top Si layer Oxide layer Si substrate p⁺ SiGe epi Pure boron layer Capping layer p⁻ Si epi Top Si layer Oxide layer Si substrate Blind vias Circuit elements p⁻ Si epi Top Si layer Oxide layer Si substrate 2<sup>ND</sup> Si handle substrate Protective layer Circuit elements p⁻ Si epi Top Si layer Oxide layer Si substrate 2<sup>ND</sup> Si handle substrate Protective layer Circuit elements p⁻ Si epi Top Si layer Etched oxide 2ᴺᴰ Si handle substrate Protective layer Circuit elements p⁻ Si epi Top Si layer p+ SiGe epi Etched oxide 2ᴺᴰ Si handle substrate Protective layer Circuit elements p⁻ Si epi Top Si layer p+ SiGe epi Pure boron layer 2ᴺᴰ Si handle substrate Protective layer Circuit elements p⁻ Si epi Top Si layer p+ SiGe epi Pure boron layer Capping layer

BACK-ILLUMINATED SENSOR AND METHOD OF MAKING SAME

CROSS-REFERENCE TO RELATED APPLICATIONS

This application claims priority to the provisional patent application filed Oct. 31, 2023 and assigned U.S. App. No. 63/546,530, the disclosure of which is hereby incorporated by reference.

FIELD OF THE DISCLOSURE

This disclosure relates to image sensors.

BACKGROUND OF THE DISCLOSURE

The integrated circuit industry requires inspection tools with increasingly higher resolution and sensitivity to resolve ever smaller features and higher densities of integrated circuits, reticles (photomasks), solar cells, or charge coupled devices, as well as to detect defects whose sizes are of the order of, or smaller than, those feature sizes.

Inspection systems operating at short wavelengths (e.g., wavelengths shorter than about 250 nm) can provide such resolution in many cases. For reticle and wafer inspection, it can be desirable to inspect using a wavelength identical to or close to the wavelength of lithography (i.e., close to 193.4 nm for immersion lithography and close to 13.5 nm for extreme ultraviolet lithography) and feature size because the phase-shifts of the inspection light caused by the patterns will be identical or similar to those caused during lithography. For inspecting semiconductor patterned wafers, inspection systems operating over a relatively broad range of wavelengths, such as a wavelength range that encompasses the near ultraviolet (UV), deep ultraviolet (DUV), and/or vacuum ultraviolet (VUV) ranges, can be advantageous because a wide range of wavelengths offer operational flexibility to provide high sensitivity for different process layers and pattern dimensions.

To detect small defects or particles on reticles and semiconductor wafers, high signal-to-noise ratios are needed. High photon flux densities are required to ensure high signal-to-noise ratios when inspecting at high speed because statistical fluctuations in the arrival of individual photons (Poisson noise) is the fundamental limit of signal-to-noise ratio. In many cases, approximately 100,000 or more photons per pixel are needed. Sensors used for inspection systems are typically exposed to large doses of radiation after only a few months of 24-hour inspection operation. Radiation endurance is one of the requirements for sensors to have performance stability used for inspection systems.

High spectral sensitivity is another requirement for sensors used for inspection, metrology, and related applications. As explained above, high signal-to-noise ratios are required. If the sensor does not convert a large fraction of incident photons into signal, then a brighter light source would be required to sustain the same inspection or measurement speed compared with an inspection or metrology system with a more efficient sensor. Employing a brighter light source could cause damage or degradation over time on the instruments optics and the sample being inspected. A brighter light source also can be more expensive or, particularly at DUV and VUV wavelengths, may not be available.

Strong surface absorption of DUV and VUV radiation by silicon poses a challenge for sensors used for inspection at these wavelengths. Such wavelengths may be mostly absorbed within about 10 nm or a few tens of nm of the surface of silicon, in contrast to about 100 nm or more into the silicon at visible wavelengths or extreme ultraviolet (EUV) wavelengths. A high density of inherent surface defects (such as dangling bonds, vacancies, or interstitials) on silicon, affecting the electrical conductivity and recombination processes in semiconductors, may be an issue for a sensor intended to operate at DUV or VUV wavelengths. The efficiency of a sensor operating at DUV or VUV wavelengths may depend on how large a fraction of the photoelectrons created near the silicon surface can be collected before carrier recombination and carrier trapping.

Boron has been considered to address some of these issues with sensor designs. However, reflection loss from the interfaces (i.e., the boron-silicon interface and the air-boron interface) and absorption loss in a boron layer are roadblocks for the boron-coated silicon sensors to attain higher quantum efficiency at the VUV and DUV wavelengths. The reflection loss from the interfaces stems from the large refractive index mismatch between silicon and boron at these wavelengths. Owing to the optical losses, an upper limit to the photon fraction transmitted into silicon with a 2 nm-thick boron overlayer is about 0.2 to 0.3 in the VUV and DUV. Thus, about 70% of incident photons are lost, not contributing to photocarrier generation in silicon.

Improved sensors and methods of fabrication are needed.

BRIEF SUMMARY OF THE DISCLOSURE

An image sensor is provided in a first embodiment. The image sensor includes a p-type silicon layer; a silicon layer disposed on the p-type silicon layer; a p-type SiGe layer disposed on the p-type silicon layer; a boron layer disposed on the p-type SiGe layer; and an anti-reflective coating disposed on the boron layer.

The image sensor may further include a polysilicon layer disposed on a side of the p-type silicon layer opposite of the silicon layer.

The image sensor may further include a metal layer disposed on the polysilicon layer.

The p-type SiGe layer may be a contiguous layer.

The boron layer may be a contiguous layer.

The p-type SiGe layer may have a thickness from 20-50 nm.

The boron layer may have a thickness from 2-20 nm.

The p-type SiGe layer may be disposed directly on the p-type silicon layer and the silicon layer.

The boron layer may be disposed directly on the p-type SiGe layer.

In an embodiment, the silicon layer defines a trench that exposes the p-type silicon layer at a bottom of the trench. The p-type SiGe layer is disposed on the bottom of the trench such that the p-type SiGe layer is disposed on the p-type silicon layer and on the silicon layer that forms the trench. The boron layer is disposed on the p-type SiGe layer in the trench.

The image sensor may further include a second silicon handle substrate disposed on the p-type silicon layer opposite the p-type SiGe layer.

The image sensor may further include an oxide layer disposed between the p-type silicon layer and the silicon layer.

An inspection system can include an embodiment of the image sensor.

A method of fabricating an image sensor is provided in a second embodiment. The method includes forming a p-type silicon layer on a silicon layer. A p-type SiGe layer is formed on the p-type silicon layer. The p-type SiGe layer is coated with a boron layer. An anti-reflective coating is formed on the boron layer.

The method may further include forming a polysilicon layer on a side of the p-type silicon layer opposite of the silicon layer.

The method may further include performing a metallization process thereby adding a metal layer on the polysilicon layer.

The p-type silicon layer or the p-type SiGe layer may be formed using epitaxial growth.

The method may further include an annealing step after the boron layer is formed whereby boron from the boron layer is driven into the p-type SiGe layer. In an example, the annealing step is from 450° C. to 950° C.

In an embodiment, the method includes etching a trench in the silicon layer. The trench exposes the p-type silicon layer at a bottom of the trench. The p-type SiGe layer is disposed on the p-type silicon layer at the bottom of the trench and on the silicon layer forming sidewalls of the trench.

DESCRIPTION OF THE DRAWINGS

For a fuller understanding of the nature and objects of the disclosure, reference should be made to the following detailed description taken in conjunction with the accompanying drawings, in which:

FIGS. 1-6 show cross-sectional side views of a method of manufacturing an image sensor in accordance with an embodiment of this disclosure;

FIGS. 10-16 show cross-sectional side views of another exemplary process to fabricate an image sensor on a silicon substrate utilizing partial wafer thinning;

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein include a silicon germanium (SiGe) epilayer between the boron layer and silicon to improve VUV and DUV sensitivity, while retaining the long-term stability offered by boron. Resulting image sensors can be used with DUV and VUV applications. The resulting image sensors are suitable for use in wafer and reticle inspection systems and for other metrology applications.

While an optional anti-reflection coating over the boron layer can improve the reflection loss from the air-boron interface, it was found that the loss from the boron-silicon interface can be improved by adding an interlayer with intermediate refractive indices between boron and silicon at the VUV and DUV wavelengths. In addition to providing an appropriate refractive index, the interlayer is that the interlayer material may be electronically compatible with silicon. The energy barrier for electron transport across the interlayer and silicon may be negligible to retain efficient charge transfer and charge collection.

Silicon germanium alloy emerges as a promising interlayer material sandwiched between the silicon epilayer (p-type silicon layer) and the (amorphous) boron layer in boron-coated sensors for inspection systems at the near UV, DUV, and/or VUV wavelengths. SiGe exhibits a higher refractive index compared to silicon but lower than boron at these wavelengths. The index of refraction of SiGe is also tunable by adjusting the germanium fraction. Regarding electronic compatibility, there is a small conduction band offset at the silicon-silicon germanium interface, which may be beneficial for efficient electron transport across the heterojunction. For instance, there may be less than a 0.05 eV offset in the conduction band between SiGe (with 50% germanium) and silicon. In addition to the optical and electronic benefits, a dislocation-free SiGe layer can be epitaxially grown on silicon substrates using chemical vapor deposition (CVD) or molecular beam epitaxy (MBE) techniques. A high quality SiGe layer can provide minimal crystal defects or electron traps which could affect electron transport.

Figure 1:

FIGS. 1-6 illustrate a method of manufacturing an image sensor 100. In FIG. 1, a silicon layer 101 is shown. The silicon layer 101 may be a silicon substrate in an embodiment. The silicon layer 101 may be highly p-doped (i.e., p+), such as from greater than $1 \times 10^{18}$ cm$^{-3}$. The image sensor 100 may have a thickness from 0.5 mm to 1 mm. For example, the silicon layer 101 may have a thickness from 675±20 μm with a 6-inch wafer and 750±25 μm for an 8-inch wafer.

Figure 2:
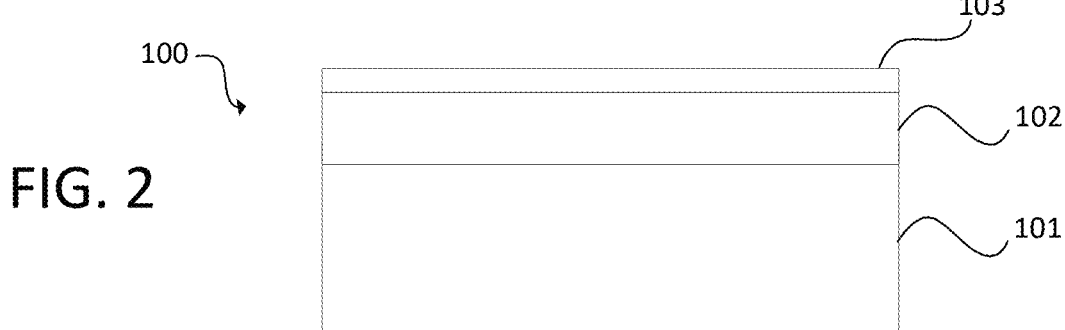

A p-type silicon layer 102 is formed on the silicon layer 101 in FIG. 2. Optionally, a polysilicon layer 103 is formed on a side of the p-type silicon layer 102 opposite of the silicon layer 101. The p-type silicon layer 102 can be formed using epitaxial growth or other techniques. The side of the image sensor 100 with the polysilicon layer 103 may be referred to as the front end.

Circuit elements for the CCD sensor, CMOS sensor, or photodiode can be fabricated in the polysilicon layer 103. This may include one or more steps to dope the polysilicon layer 103 in specific regions, dielectric deposition and patterning, polysilicon contact deposition, and patterning to form front die circuit elements.

Figure 3:
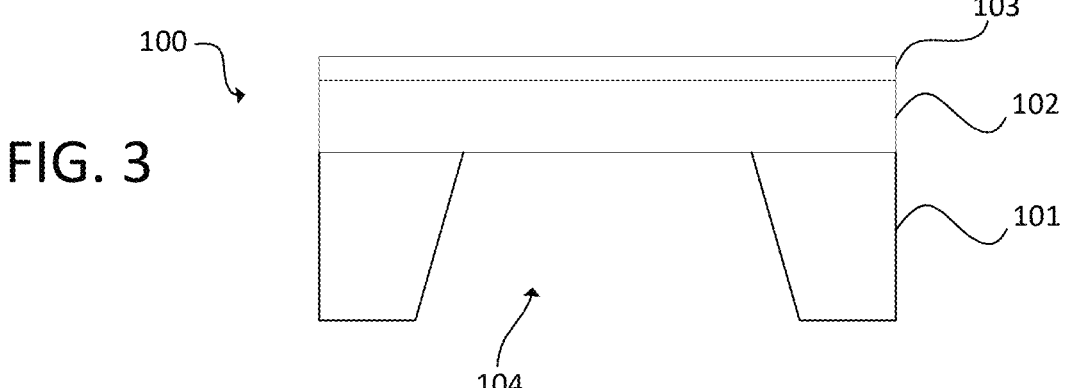

In FIG. 3, a trench 104 is etched in the silicon layer 101. The trench 104 exposes the p-type silicon layer 102 at the bottom of the trench 104. The trench also includes sidewalls formed from the silicon layer 101. The trench 104 can be formed through etching. In an instance, the etching is wet etching. Grinding also may be used with or without the etching to form the trench 104. The grinding can thin the side of the image sensor opposite the p-type silicon layer 102, such as by thinning the silicon layer 101. The side of the image sensor 100 with the trench 104 may be referred to as the back surface. In an instance, the silicon layer 101 is subject to grinding down to approximately 300 µm followed by a wet etch to open the trench 104 to expose the light-active areas of the p-type silicon layer 102.

In FIG. 4, a p-type SiGe layer 105 is formed in the trench 104. The p-type SiGe layer 105 is formed on a bottom of the trench 104 (i.e., on the p-type silicon 102) and on the sidewalls of the trench 104 (i.e., on the silicon layer 101). The p-type SiGe layer 105 also can be formed on a surface of the silicon layer 101 opposite the p-type silicon layer 102 outside the trench 104. The p-type SiGe layer 105 can be formed using epitaxial growth, chemical vapor deposition (CVD), molecular beam epitaxy (MBE), or other techniques. Epitaxial growth may occur at a temperature from 500° C. to 850° C. (e.g., 550° C. to 700° C.). The p-type SiGe layer 105 may have a thickness from <50 nm (e.g., 20-50 nm or less than 20 nm). In another example, the p-type SiGe layer 105 has a thickness of less than 100 nm.

In FIG. 5, the p-type SiGe layer 105 is coated with a boron layer 106. The boron layer 105 may have a thickness less than 100 nm, such as less than 20 nm or from approximately 2-20 nm. The boron layer 106 can be pure boron. The boron layer 105 can be in the trench 104 on both the bottom and sidewalls. The boron layer 105 also can be on other surfaces, such as across a surface of the silicon layer 101 adjacent to the trench 104. The boron layer 106 may be deposited using a CVD process, such as using $B_2H_6$ as a precursor gas with $H_2$ and/or $N_2$ carrier gases. Other possible techniques include MBE, atomic layer deposition (ALD), or physical vapor deposition (PVD).

The SiGe layer 105 can reduce the refractive index mismatch between the boron layer 106 and the silicon layer 101 or p-type silicon layer 102. The refractive index mismatch is an optical property based on how atoms are arranged and their resultant electromagnetic properties.

After the boron layer 106 is formed, an optional annealing step may be performed. Boron from the boron layer 106 can be driven into the p-type SiGe layer 105 during the annealing. The annealing may be performed at a temperature greater than 400° C., such as from 450° C. to 950° C. (e.g., 450° C. to 700° C. or 450° C. to 850° C.). The boron layer 106 also may be formed at these temperatures, so the temperature can be applied during formation of the boron layer 106.

One advantage of higher deposition temperatures (e.g., between 600° C. and 900° C.) for the boron is that at such temperatures, boron readily diffuses into the SiGe layer 105 and/or silicon yielding a heavily p-doped (i.e., p+) layer. The heavily p-doping can ensure a high quantum efficiency to DUV and VUV radiation because it creates a high and static electric field gradient near the surface that accelerates electron separation from the surface into the silicon layer for charge collection. The boron layer 106 can passivate the light-active back surface of image sensors against oxidation attacks to the silicon and degradation under heavy doses of DUV and/or VUV radiation.

The p-type SiGe layer 105 can be doped by using boron. It can be done while SiGe is being deposited during growth by introducing $B_2H_6$ gas into the gas mix of a CVD process. In another instance, a drive-in step can be added after boron deposition by heating wafer to >700° C. for less than 5 minutes so that some boron from the boron layer 106 diffuses into the p-type SiGe layer 105. The p-type SiGe layer 105 can be monotonically p-type doped using boron from the boron layer 106 from the surface to the bulk of the p-type SiGe layer 105. The boron doping profile can be tuned such that highest concentration is close to surface and monotonically decreasing into the bulk causing a high electric field for charge collection.

In an embodiment, the drive-in provides a surface concentration $>1\times10^{19}$ cm$^{-3}$ that decreases monotonically into the bulk within <100 nm. This may be within <20 nm for high surface field. Typical drive-in temperatures are >700° C. because boron moves less below this temperature. Less than 700° C. also can be used for a narrow doping profile of, for example, <20 nm. Boron is typically deposited at 675° C. so there may be some inherent doping. The inherent doping may be enough that an additional annealing step is not required.

In an instance, the p-type SiGe layer 105 is strained. The SiGe layer may be thin (e.g., <50 nm) so the effect of strain can cause some crystal defects in SiGe. High boron doping can compensate the strain and can offset the carrier recombination in SiGe by creating a high electric field at the surface.

The p-type SiGe layer 105 may include a $Si_xGe_{1-x}$ composition factor x from 0 to 1. The value of the composition factor x depends on the processing conditions. In another example, the composition factor x can vary continuously from 0 under the boron layer 106 to 1 over the silicon layer 101.

The p-type SiGe layer 105 may be an active layer for photogeneration. For photogeneration, there may be <50 nm thickness, a back surface/illuminated surface of an image sensor, and monotonic boron doping decreasing from the surface to the bulk. In an instance, the doping may vary from $>1\times10^{19}$ cm$^{-3}$ at the surface to a bulk concentration of $<1\times10^{14}$ cm$^{-3}$ for high electric field and efficient charge collection. SiGe is the active layer along with the p-type silicon layer 102. There will be some tail of light that will not be absorbed in SiGe which will be absorbed in the p-type silicon layer 102 for photogeneration.

In FIG. 6, an anti-reflective coating 107 is formed on the boron layer 106 in the trench 104. While only disclosed in the trench 104 in FIG. 6, the anti-reflective coating 107 can be formed on other surfaces of the boron layer 106. The anti-reflective coating 107 can improve performance of the image sensor 100. The anti-reflective coating 107 may be fabricated of, for example, metal fluorides (such as $MgF_2$), $SiO_2$, $Al_2O_3$, or a combination thereof. The anti-reflective coating 107 may be a single layer or a multilayer.

In an instance, the anti-reflective coating 107 may be deposited over all of the back side. This can be performed after front side metallization. Some processes for the front side can affect the anti-reflective coating 107, so the anti-reflective coating 107 may be applied before dicing.

A metal layer 108 can be added to the polysilicon layer 103 using a metallization process. The metallization may occur at a temperature of approximately 450° C. Metallization may occur before the formation of the anti-reflective coating 107. The metal layer 108 may be used with interconnects of a CMOS sensor, CCD sensor, or photodiode circuit elements. The metal layer 108 can be muti-layered with an inter layer dielectric separating the metal layers from shorting.

Besides the metal layer 108, a gate layer can be formed on the p-type silicon layer 102. The gate layer can be formed before the polysilicon layer 103 and before thinning. The gate layer can include one or more layers of dielectric materials such as $SiO_2$ or $Si_3N_4$. Circuit elements can be formed on this gate layer with polysilicon and dielectrics. Circuit elements can include transistors, diodes, resistors, capacitors, or electrical interconnects that make the light-sensitive devices function. The circuit elements can be separated by a dielectric to avoid shorts.

The substrate with the image sensor 100 may be diced and packaged into individual image sensors 100 or sensor chips after the metal layer 108 and anti-reflective coating 107 are applied.

The resulting image sensor 100 includes a p-type silicon layer 102 and a silicon layer 101 disposed on the p-type silicon layer 102. The silicon layer 101 defines a trench 104 that exposes the p-type silicon layer 102 at a bottom of the trench 104. A p-type SiGe layer 105 is disposed on the bottom of the trench 104 and on the silicon layer 101 that forms the trench 104. A boron layer 106 is disposed on the p-type SiGe layer 105 in the trench 104. An anti-reflective coating 107 is disposed on the boron layer 106 in the trench. The anti-reflective coating 107 may only be in the trench 104 or elsewhere on a surface of the image sensor 100. The anti-reflective layer 107 may be on the boron layer 105, SiGe layer 105, and lightly doped p-type silicon layer 102. This is where light lands. These layers typically end up all over the back surface (side walls and unetched regions). A polysilicon layer 103 or multi-layer may be disposed on a side of the p-type silicon layer 102 opposite of the silicon layer 101. A metal layer 108 is disposed on the polysilicon layer 103.

The various layers in the image sensor 100 may be contiguous. For example, the p-type SiGe layer 105 and boron layer 106 may be contiguous. The sidewalls and back surface may be photo inactive.

The various layers in the image sensor 100 may be formed directly upon each other (i.e., without other intervening layers). For example, the p-type SiGe layer 105 may be formed directly on the p-type silicon layer 102 and the silicon layer 101. In another example, the boron layer 106 may be formed directly on the p-type SiGe layer 105.

The image sensor 100 includes boron-coated SiGe, which is then on the silicon layer 101. The image sensor 100 exhibits a 20% to 90% increase in the VUV/DUV photon absorption efficiency as compared to that in boron-coated Si. Quantum efficiency and long-term radiation stability are improved in the image sensor 100 due to the presence of the boron layer 106. The anti-reflective coating 107 can provide further quantum efficiency improvements. In an instance, the image sensor 100 is configured for DUV and VUV wavelengths.

Figure 7:
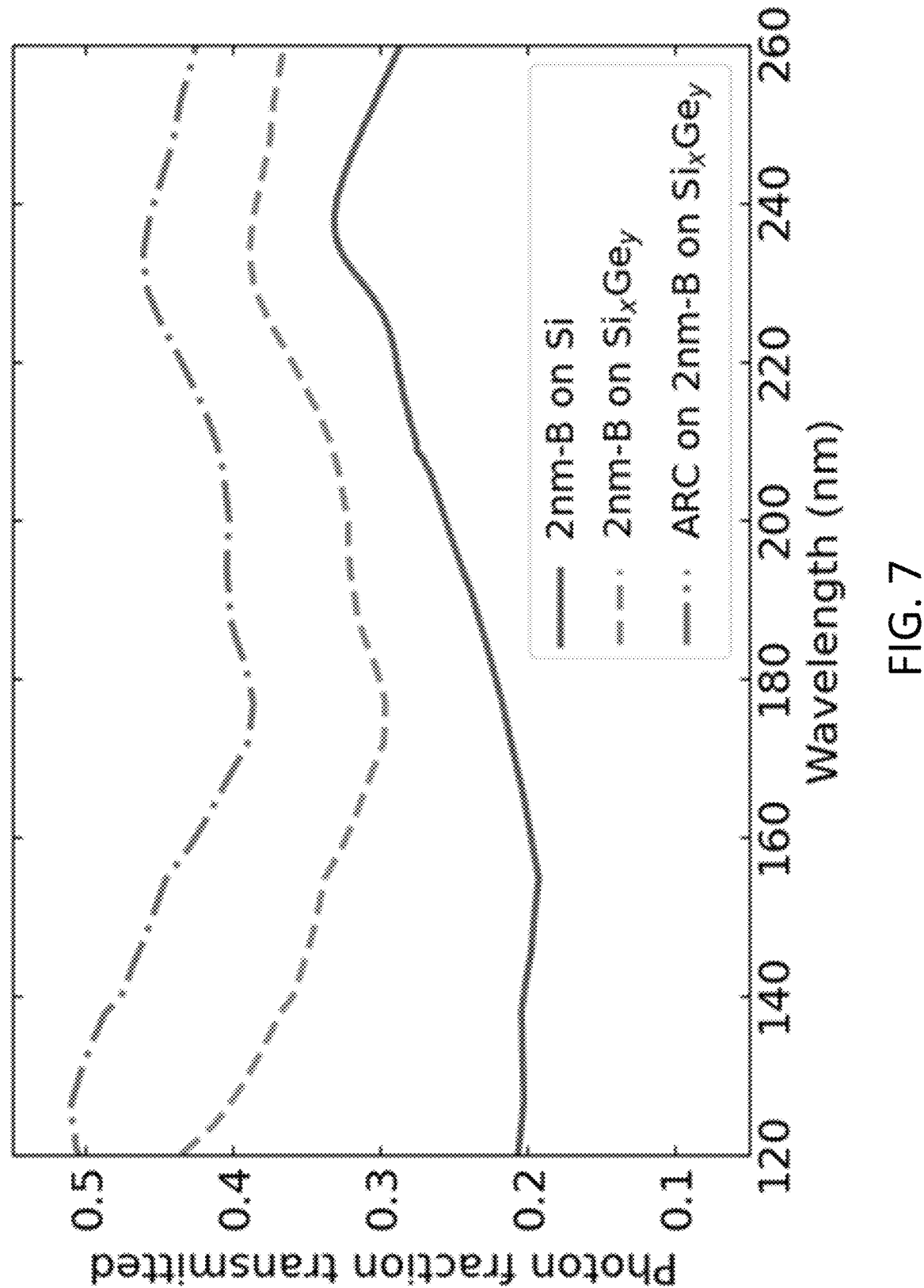
FIG. 7 shows a calculation of photon fraction transmitted into silicon and silicon germanium substrates through boron and anti-reflection overlayers at the VUV and DUV wavelengths.

The image sensor 100 with the boron-coated SiGe reduces reflection loss from the boron-SiGe interface, which can yield an approximately 1.5× to 2× increase in the VUV photon absorption efficiency. The VUV and DUV photon absorption efficiency of the image sensor is approximately 0.3 to 0.4, higher than a structure without boron. A higher photon absorption efficiency may potentially result in an increase in VUV and DUV light detection sensitivity. FIG. 7 shows a calculation of photon fraction transmitted into silicon and silicon germanium substrates through boron and anti-reflection overlayers at the VUV and DUV wavelengths.

In a particular embodiment, the image sensor 100 is a back-illuminated image sensor with a silicon membrane grown epitaxially with circuit elements on a front surface, a less than 100 nm thick p-doped SiGe layer grown epitaxially on the back surface, a less than 20 nm thick pure boron layer deposited over the SiGe layer, and an anti-reflection coating overlayer or overlayers.

A resulting sensor module array with the image sensors 100 may be a time delay integration (TDI) sensor module. In an embodiment, each TDI sensor module can include localized driving and signal processing circuitry. This circuitry can include a TDI sensor (the center block), processing circuits for processing the signals from the TDI sensor, timing and serial drive circuits, and pixel gate driver circuits. The driving/processing circuits are positioned around the TDI sensor. Thus, the TDI sensors in adjacent rows can be aligned such that at least 100% image coverage is achieved when used in a continuous scanning configuration.

Figure 8:
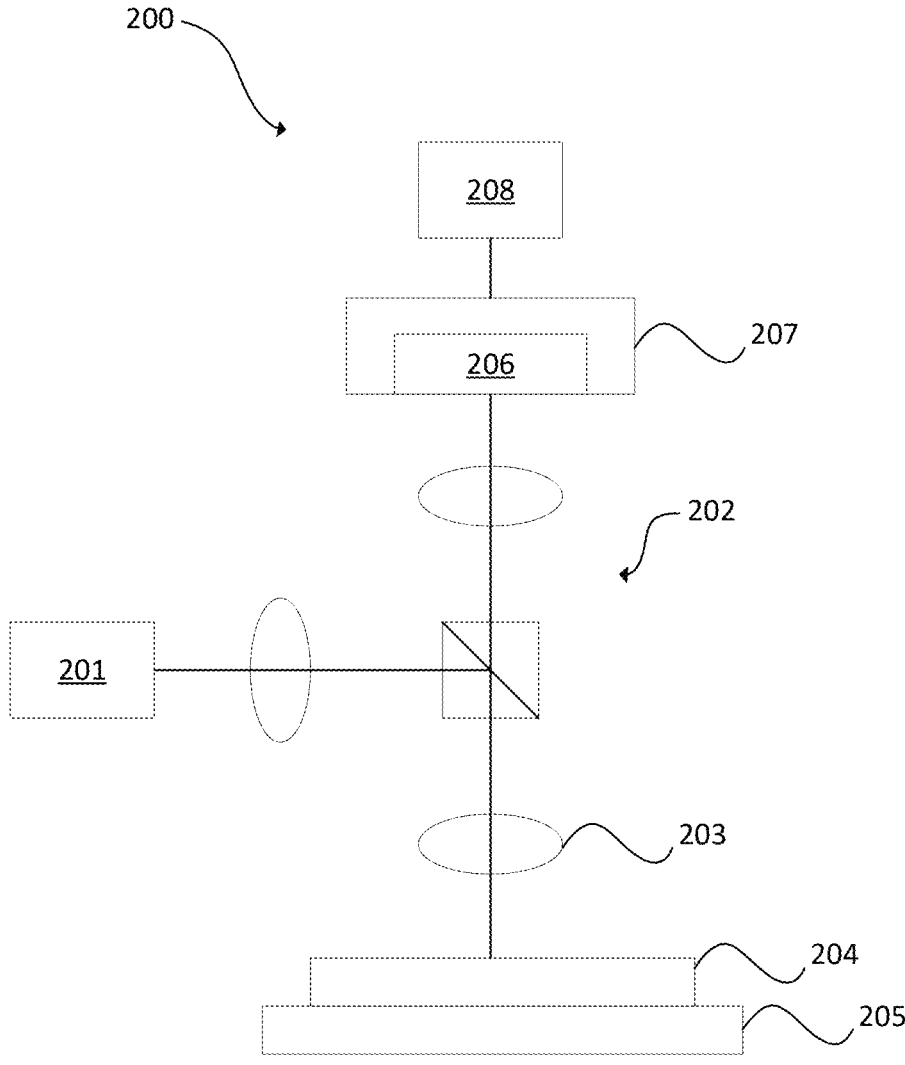
FIG. 8 illustrates an exemplary inspection system.

FIG. 8 illustrates an exemplary inspection system 200 configured to measure a sample 204 such as a wafer, reticle, or photomask. The sample 204 is placed on a stage 205 to facilitate movement to different regions of sample 204 underneath the optics 202. The stage 205 can move in one or more axes and/or can rotate. In an embodiment, the stage 205 can adjust the height of the sample 204 during inspection to maintain focus. In other embodiments, an objective lens 203 can be adjusted to maintain focus.

An illumination source 201 may include one or more lasers and/or a broad-band light source. Illumination source 201 may emit DUV and/or VUV radiation. Optics 202 including an objective lens 203 can direct that radiation toward and focus it on the sample 204. Optics 203 also may include mirrors, lenses, and/or beam splitters. Light reflected or scattered from the sample 204 can be collected, directed, and focused by the optics 202 onto a detector 206, which is within a detector assembly 207.

The detector 206 may include one or more of the image sensors described herein, including CCD sensors, CMOS sensors, and electron-bombarded images sensors incorporating an image sensor. The detector 206 may include a two-dimensional array sensor or a one-dimensional line sensor. In one embodiment, the output of the detector 206 can be provided to a processor 208, which analyzes the output. Processor 208 can be configured by program instructions, which can be stored on a carrier medium (not illustrated).

In an embodiment, the illumination source 201 may be a continuous source such as an arc lamp, a laser-pumped plasma light source, or a CW laser. In another embodiment, the illumination source 201 may be a pulsed source such as a mode-locked laser, a Q-switched laser, or a plasma light source pumped by a Q-switched laser. In an embodiment of the inspection system 200 incorporating a Q-switched laser, the image sensor or sensors within the detector 206 are synchronized with the laser pulses. In this embodiment, the image sensor may operate in a TDI mode during the laser pulse and then may readout the data through multiple outputs on both sides of the sensor in between laser pulses.

An embodiment of the inspection system 200 illuminates a line on sample 204 and collects scattered and/or reflected light in one or more dark-field and/or bright-field collection channels. In such an embodiment, the image sensor may be a line sensor or an electron-bombarded line sensor.

An embodiment of the inspection system 200 illuminates multiple spots on sample 204 and collects scattered and/or reflected light in one or more dark-field and/or bright-field collection channels. In such an embodiment, the image sensor may be a two-dimensional array sensor or an electron-bombarded two-dimensional array sensor.

Figure 9:
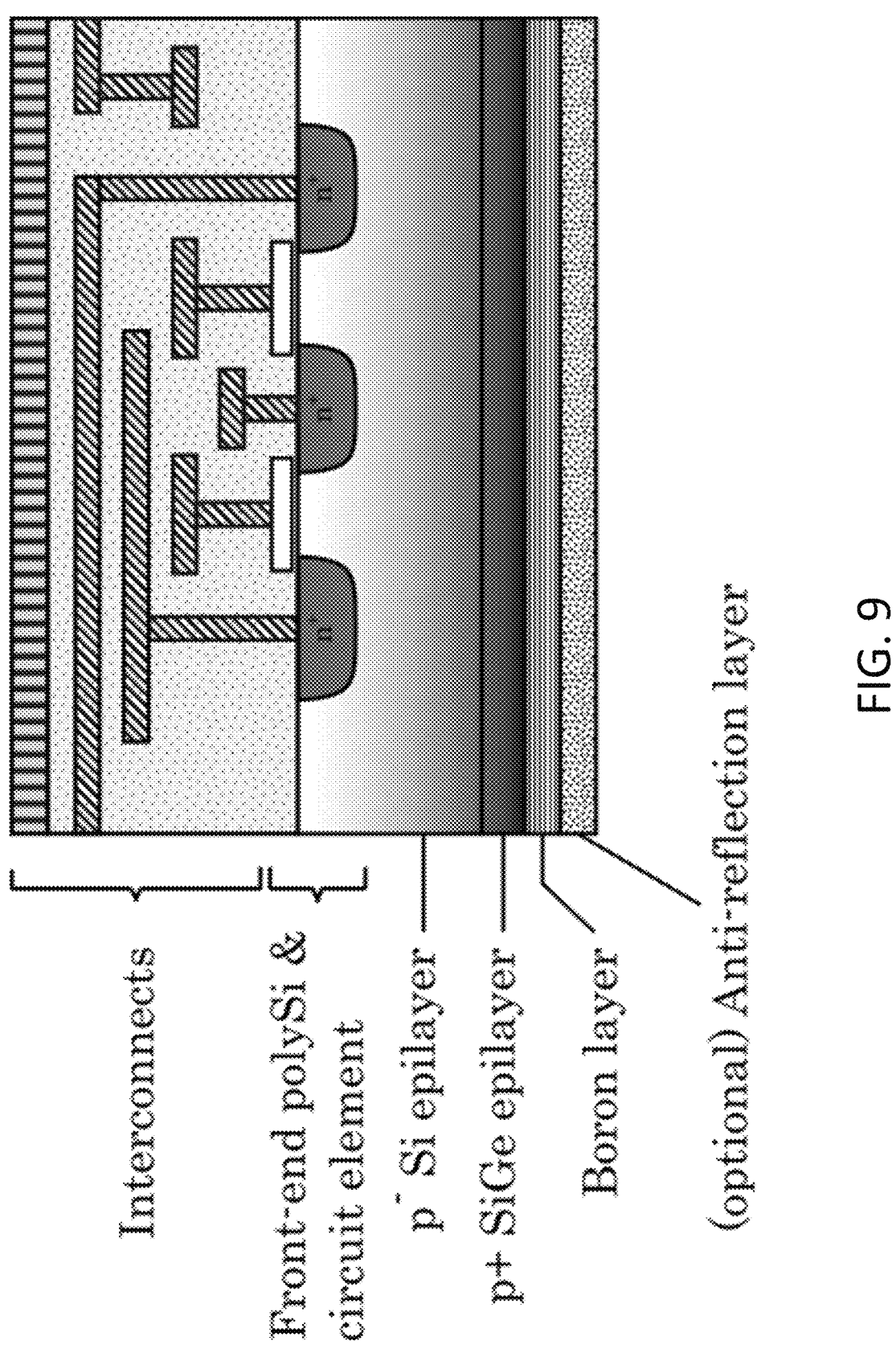
FIG. 9 is a schematic of image sensor with boron-coated silicon germanium in accordance with the present disclosure, wherein the grey gradient background in the p+ SiGe epilayer and p– Si epilayer indicates doping concentration and deep grey color refers to higher doping concentrations.
Figure 13:
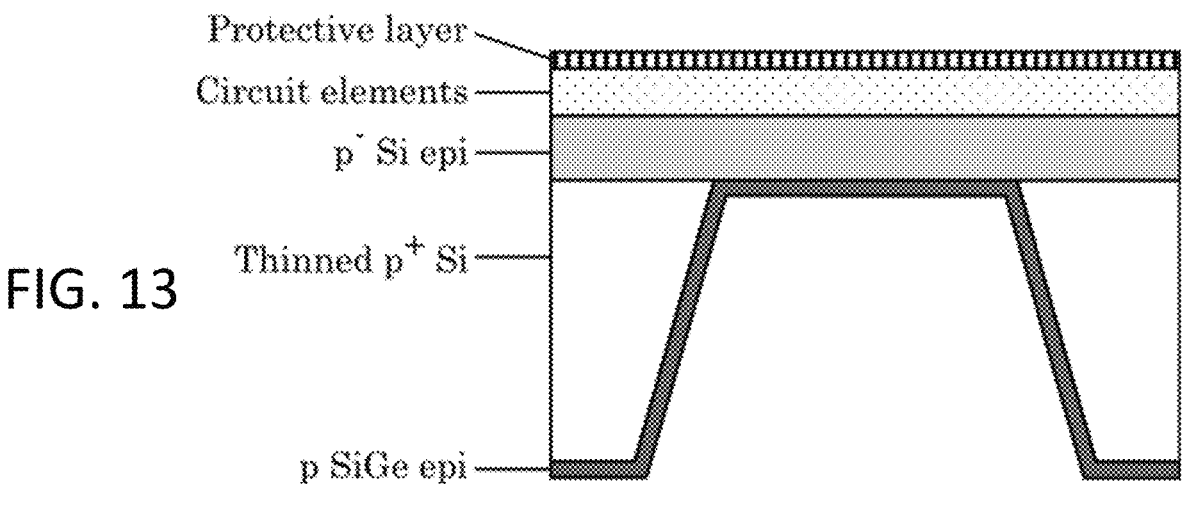
Figure 14:
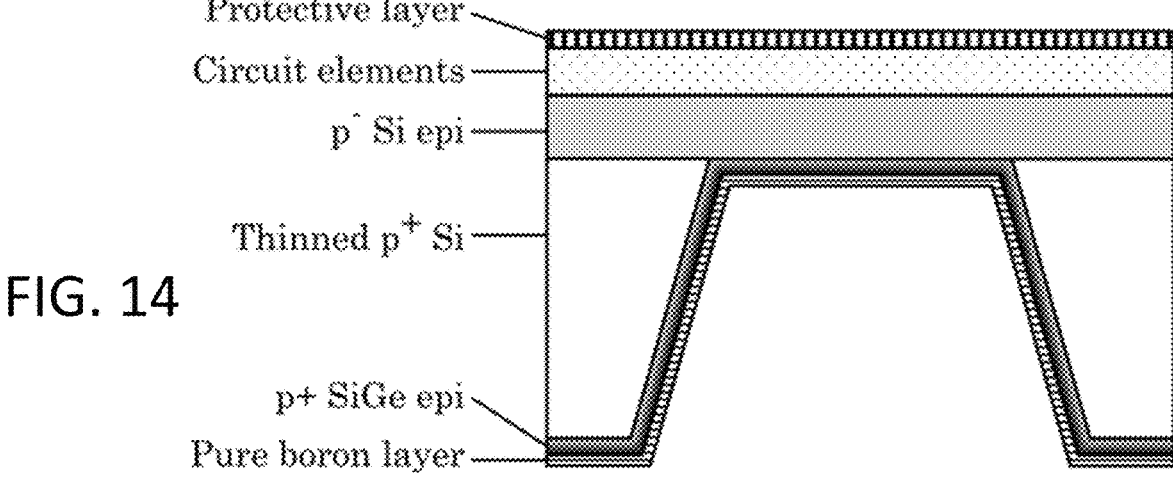
Figure 15:
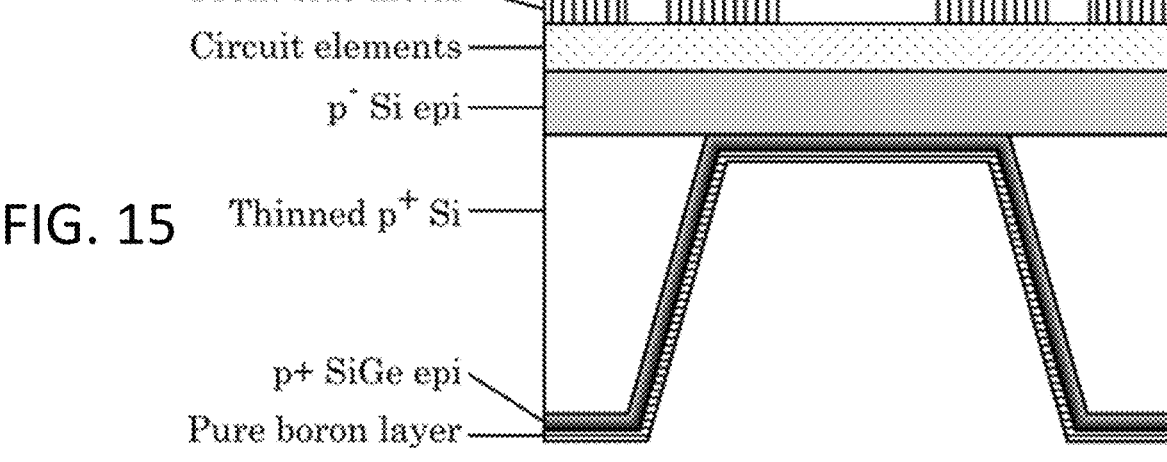
Figure 16:
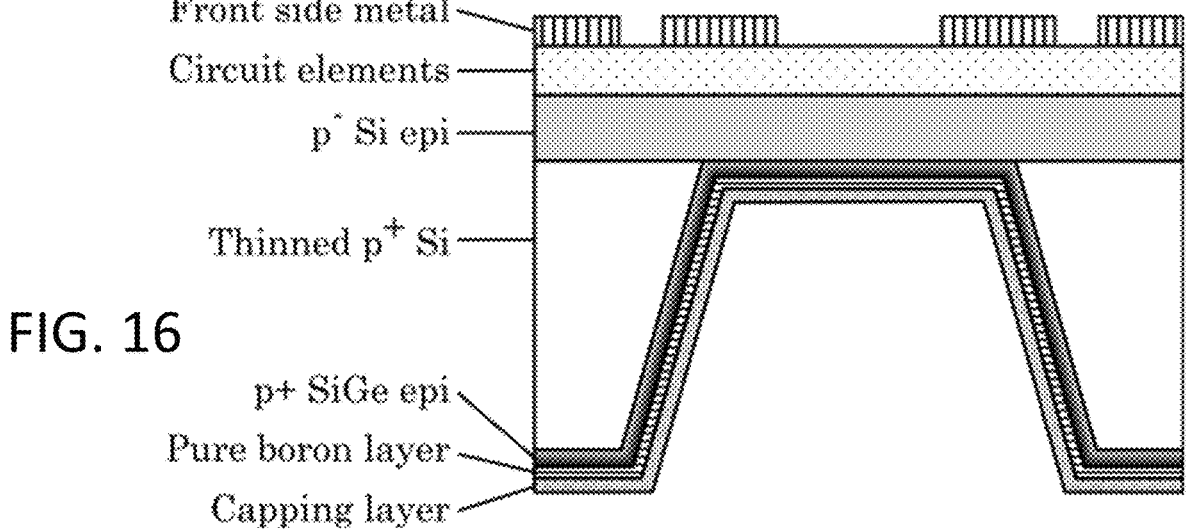
Figure 17:
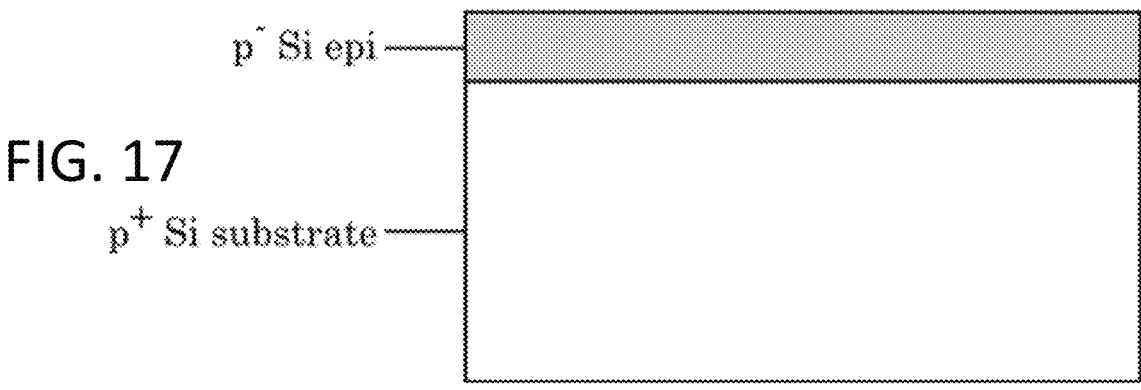
FIGS. 17-23 show cross-sectional side views of another exemplary process to fabricate an image sensor on a silicon substrate utilizing full wafer thinning.
Figure 18:
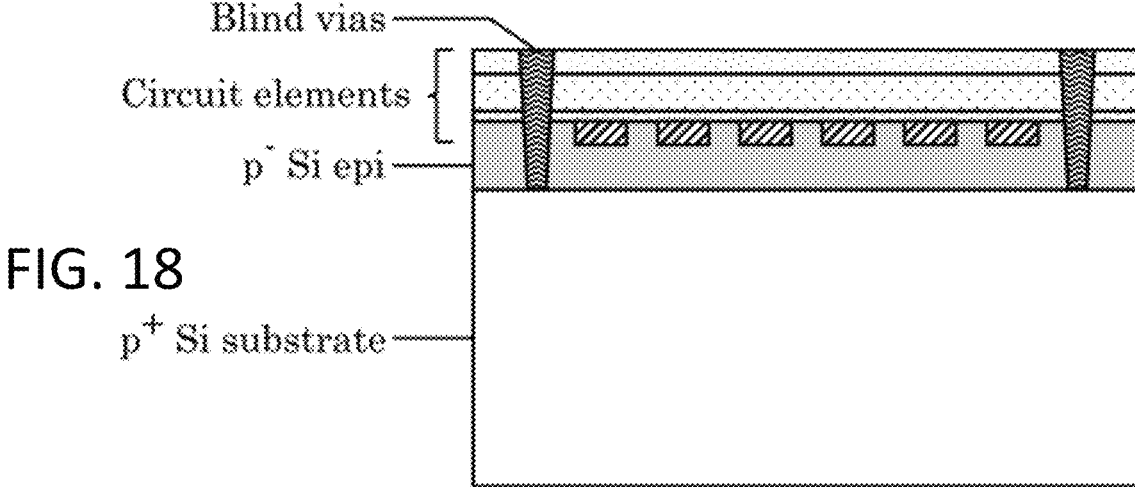
Figure 19:
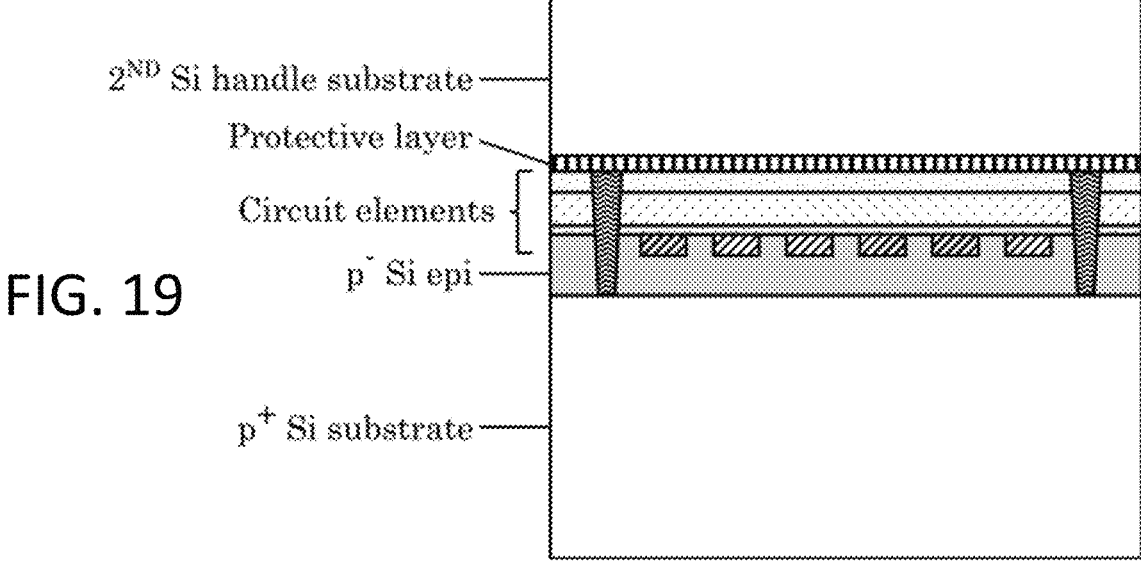

FIG. 9 is a schematic of an embodiment of an image sensor with boron-coated silicon germanium. The grey gradient background in the p+ SiGe epilayer and p− Si epilayer indicates doping concentration and deep grey color refers to higher doping concentrations. FIG. 9 shows exemplary interconnects and circuit elements.

FIGS. 10-16 show a flow diagram of cross-sectional side views of another exemplary process to fabricate an image sensor on a silicon substrate utilizing partial wafer thinning. The FIGS. 10-16 may correspond to the steps illustrated in FIGS. 1-6. The capping layer can correspond to the anti-reflective coating 107. The capping layer in FIG. 16 extends across more of the surface. The embodiment in FIGS. 10-16 also includes the circuit elements and front side metal described generally with FIGS. 1-6.

Figure 20:
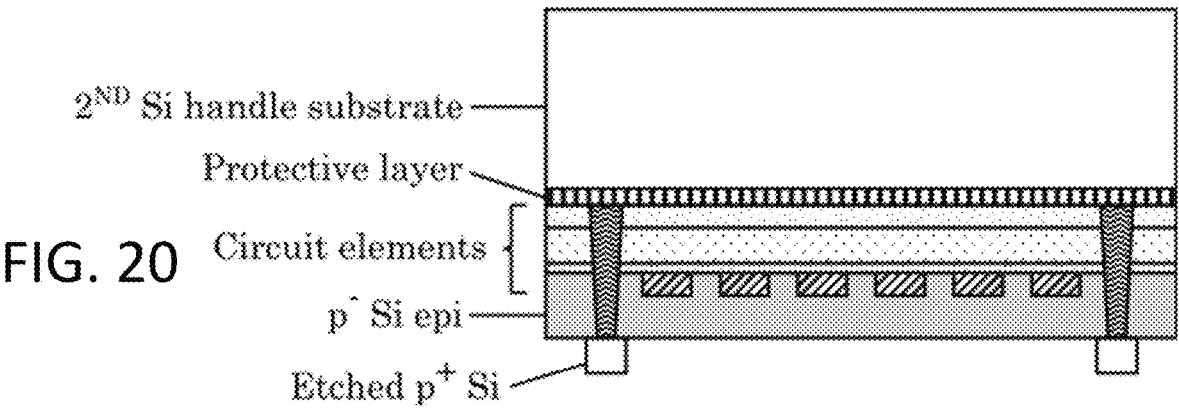
Figure 21:
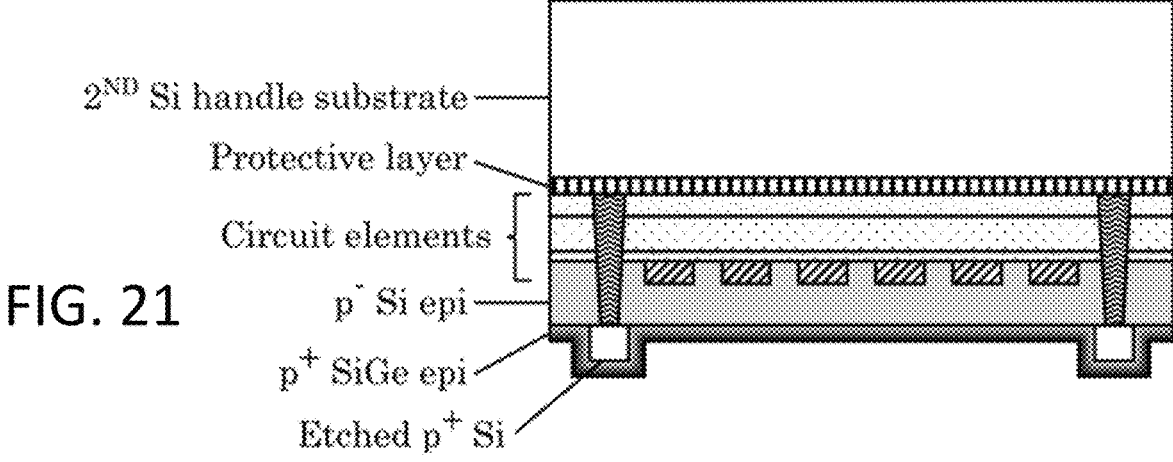
Figure 22:
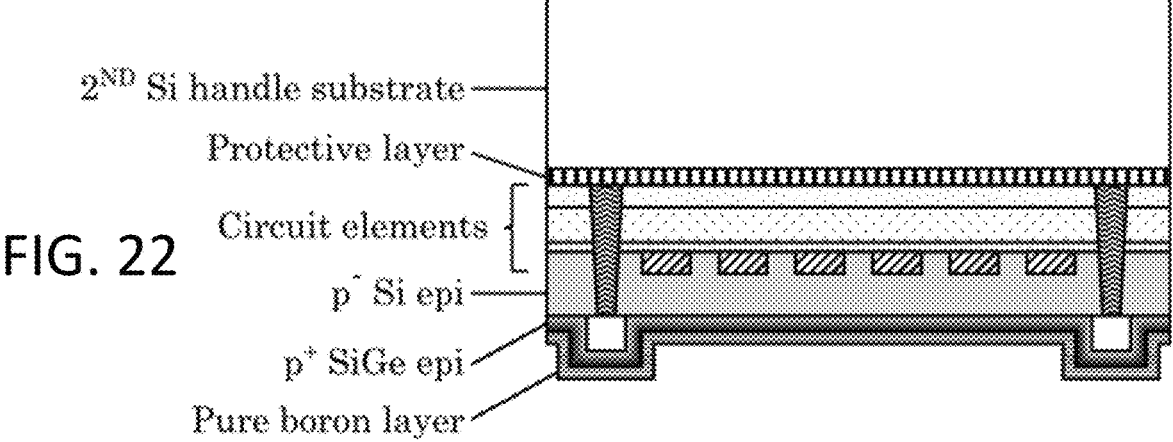
Figure 23:
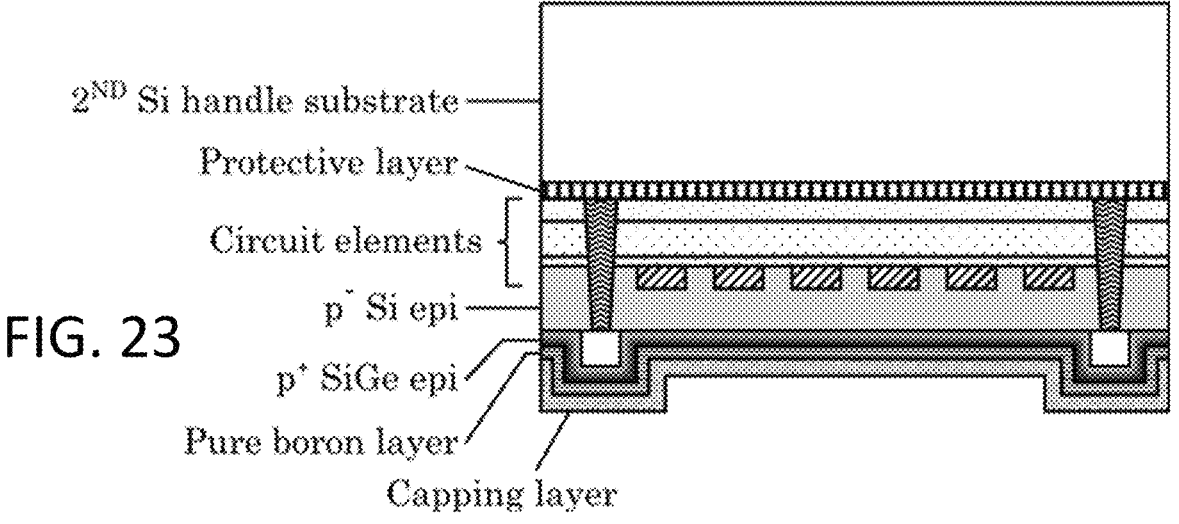

FIGS. 17-23 show a flow diagram of cross-sectional side views of another exemplary process to fabricate an image sensor on a silicon substrate utilizing full wafer thinning. A second handle substrate is disposed on a protective layer on the circuit elements on the front side in FIG. 19. In FIG. 20, the p+ silicon substrate is etched to form regions near the blind vias. A p+ SiGe layer can be epitaxially applied, as shown in FIG. 21. A boron layer is applied to the p+ SiGe layer in FIG. 23. A capping layer (e.g., an anti-reflective coating) is applied to the boron layer in FIG. 23.

Figure 24:
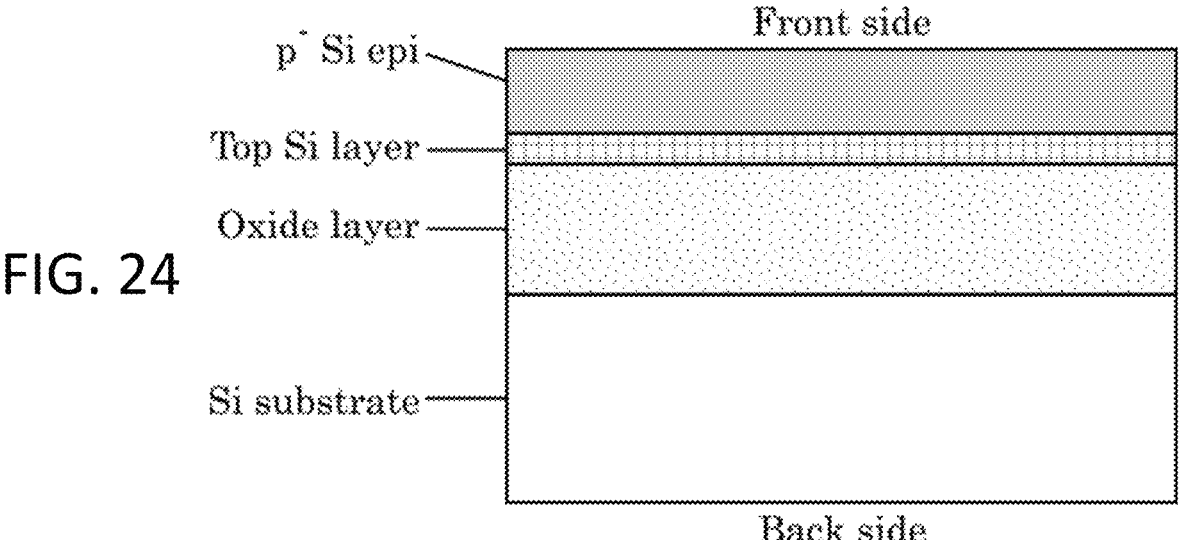
FIGS. 24-29 show cross-sectional side views of another exemplary process to fabricate an image sensor on an SOI substrate employing partial wafer thinning.
Figure 25:
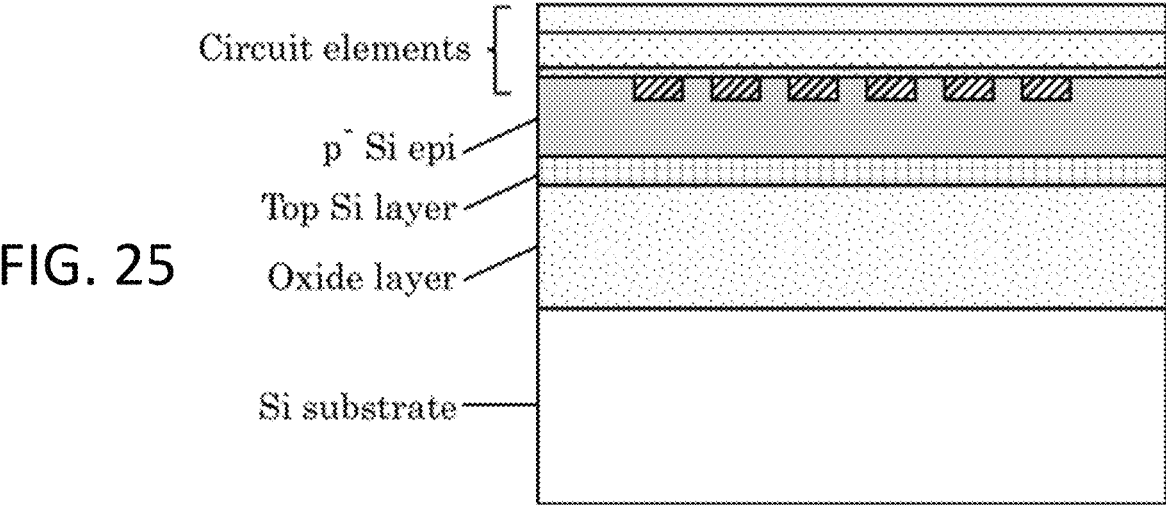
Figure 26:
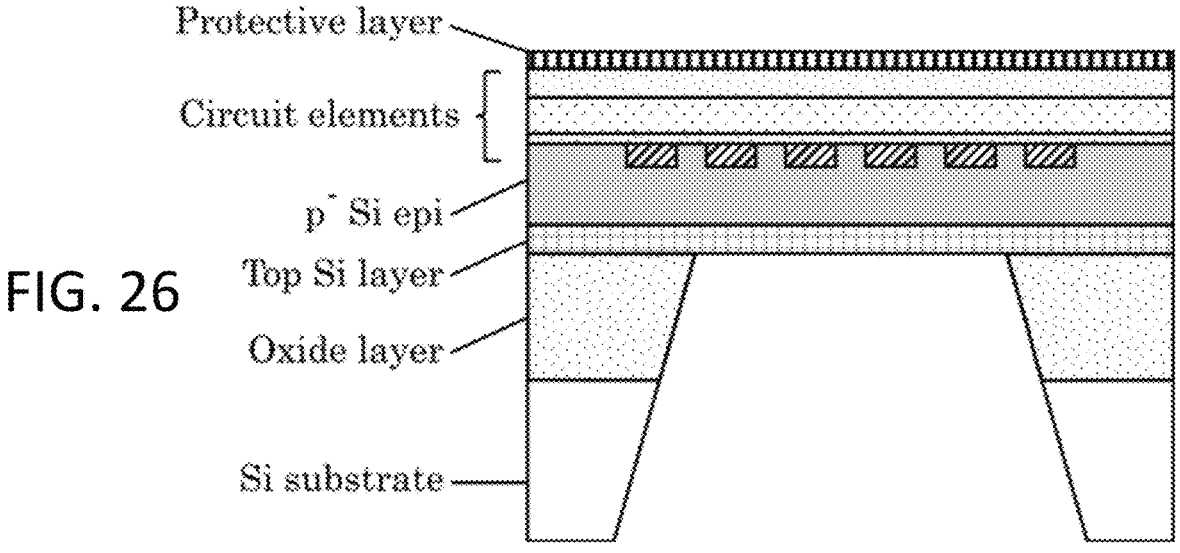
Figure 27:
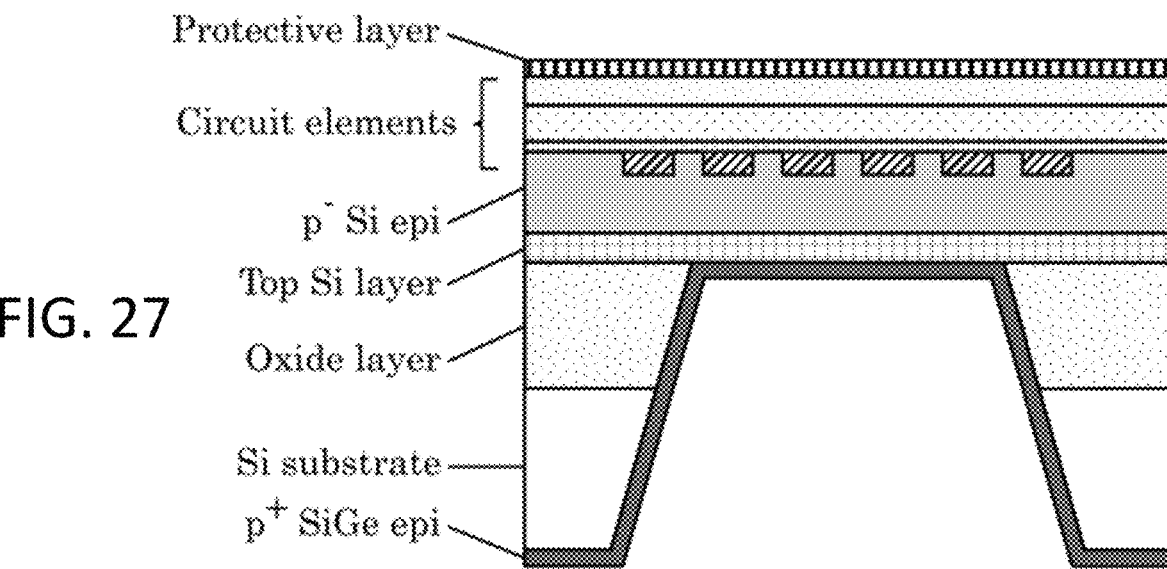
Figure 28:
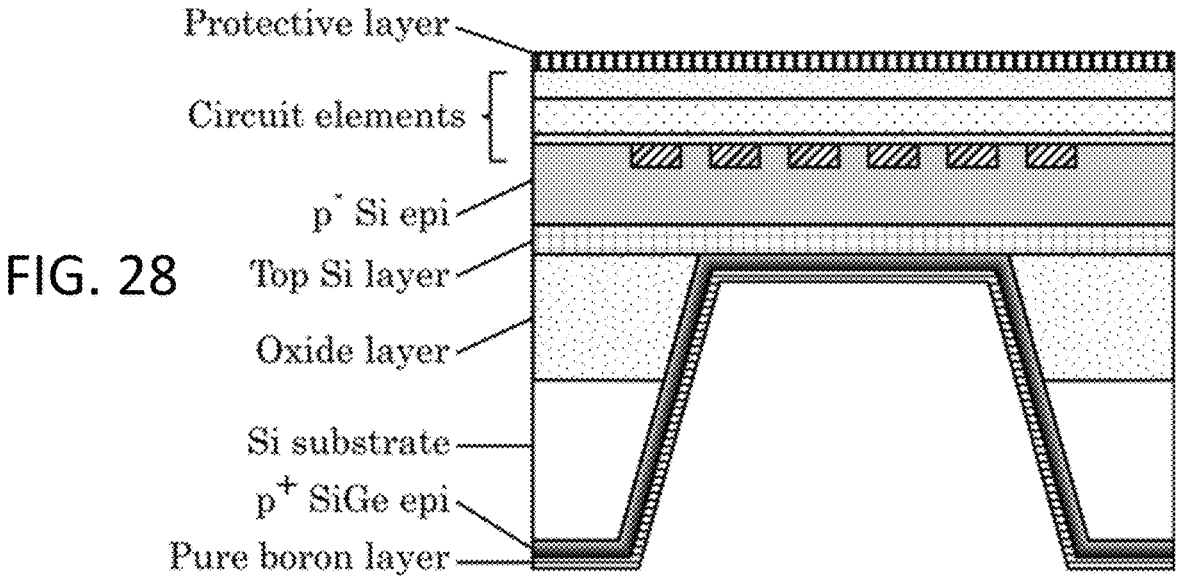
Figure 29:
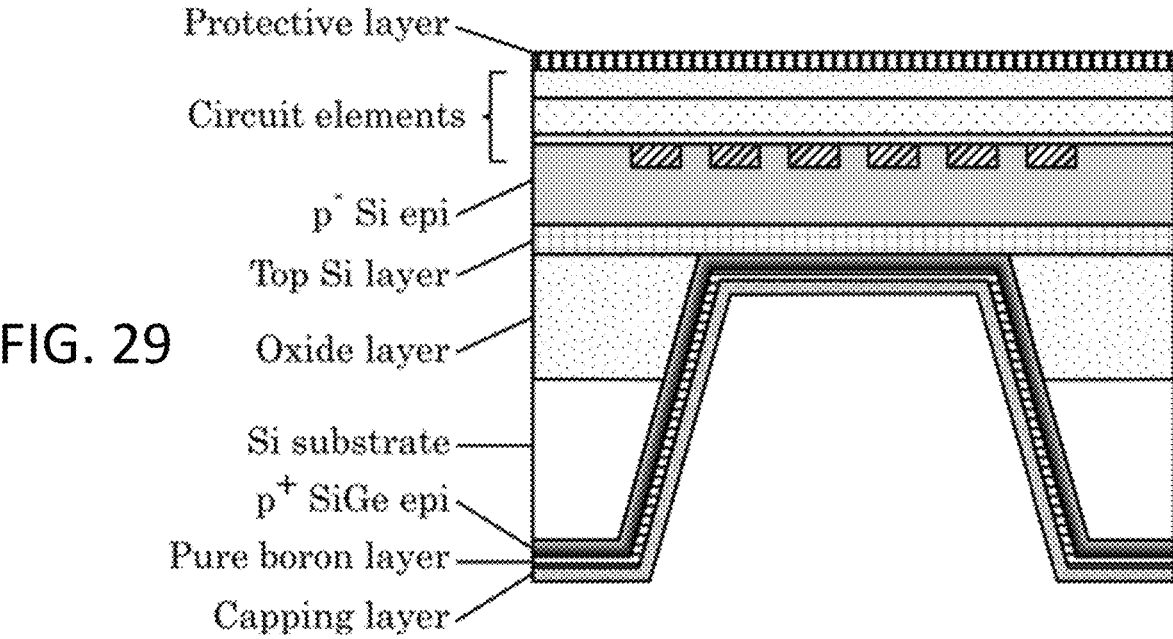

FIGS. 24-29 show a flow diagram of cross-sectional side views of another exemplary process to fabricate an image sensor on a silicon on insulator (SOI) substrate employing partial wafer thinning. As shown in FIG. 24, an oxide layer is included between the silicon substrate and the top silicon layer. The trench formed in FIG. 26 extends through the silicon substrate and the oxide layer such that the top silicon layer is exposed (such as the p-type silicon layer). The p-type SiGe (such as a p+ SiGe layer) is applied in the trench in FIG. 27. A boron layer is applied to the p-type SiGe layer, which becomes p+ SiGe due to thermal diffusion of boron in FIG. 28. A capping layer (e.g., an anti-reflective coating) is applied to the boron layer in FIG. 29.

Figure 30:
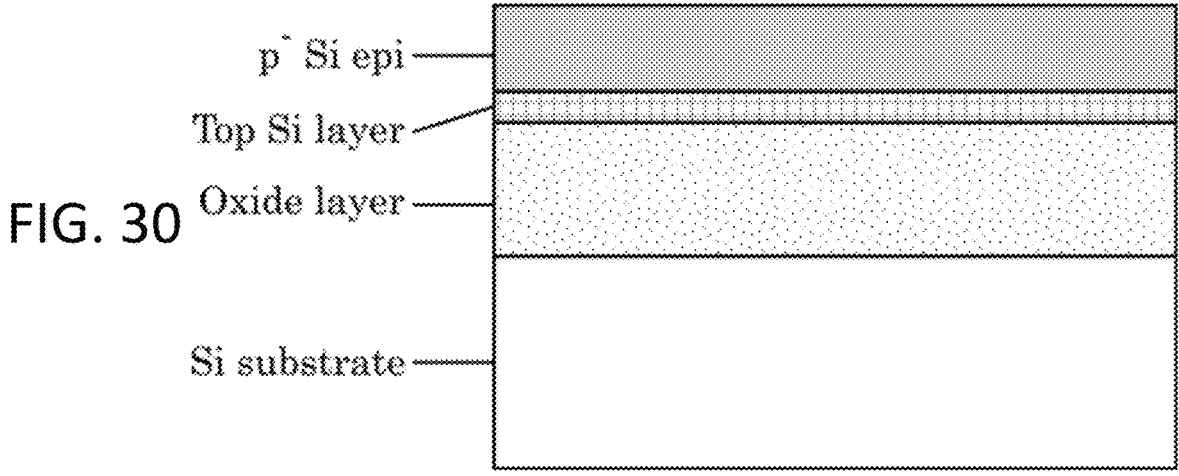
FIGS. 30-36 show cross-sectional side views of another exemplary process to fabricate an image sensor on an SOI substrate employing full wafer thinning.
Figure 31:
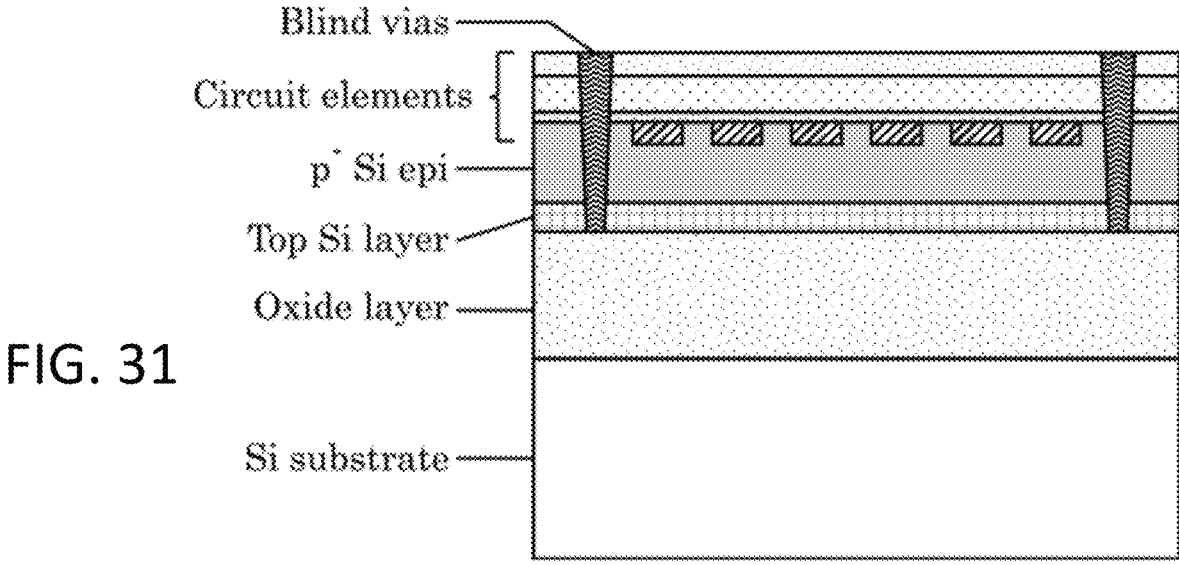
Figure 32:
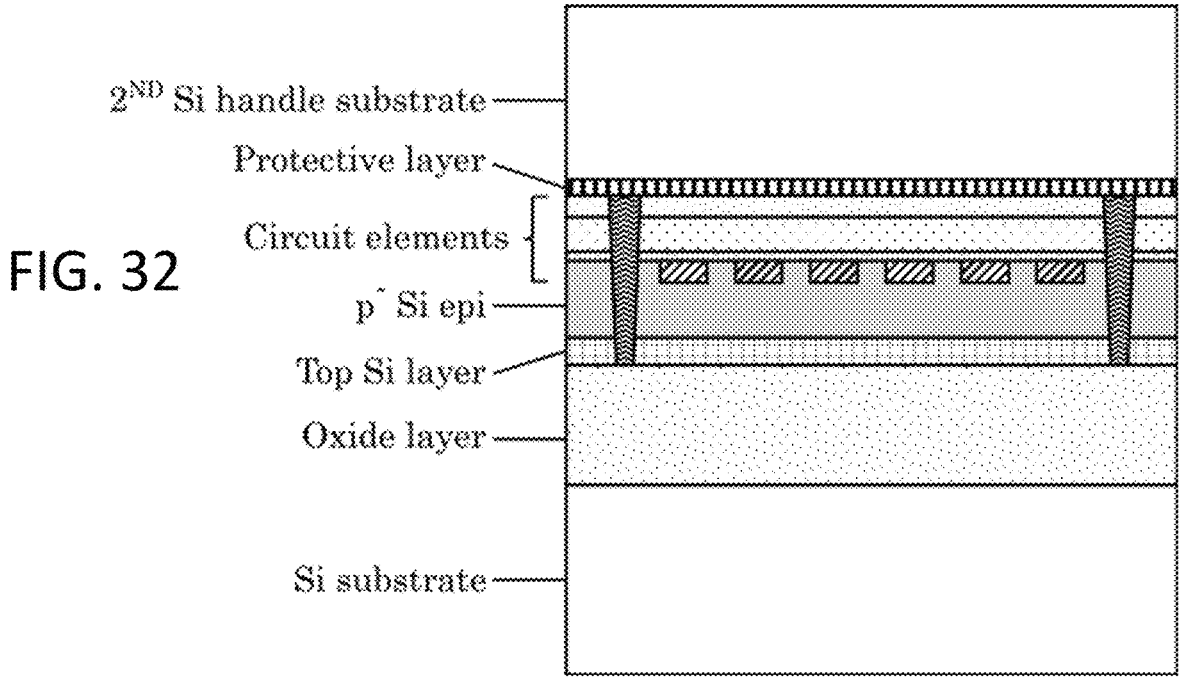
Figure 33:
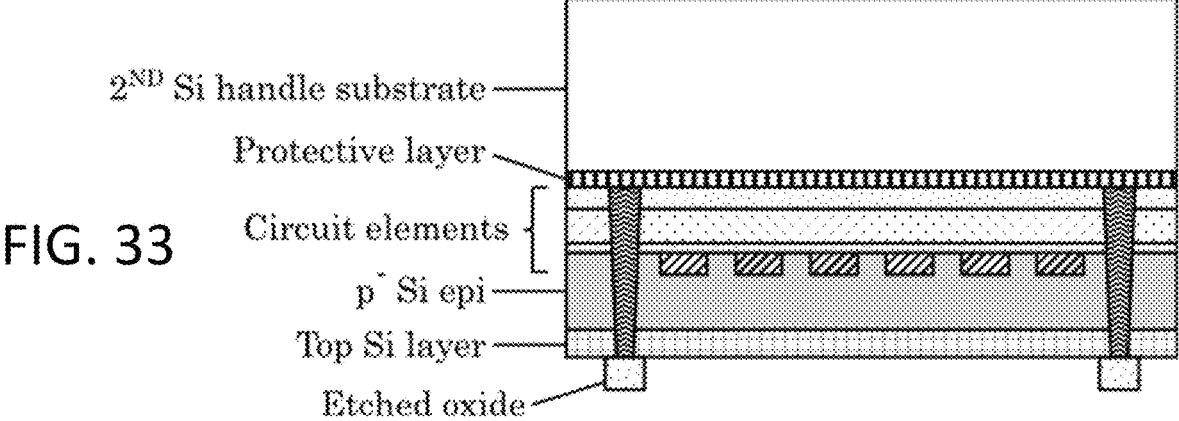
Figures 34, 35, 36:
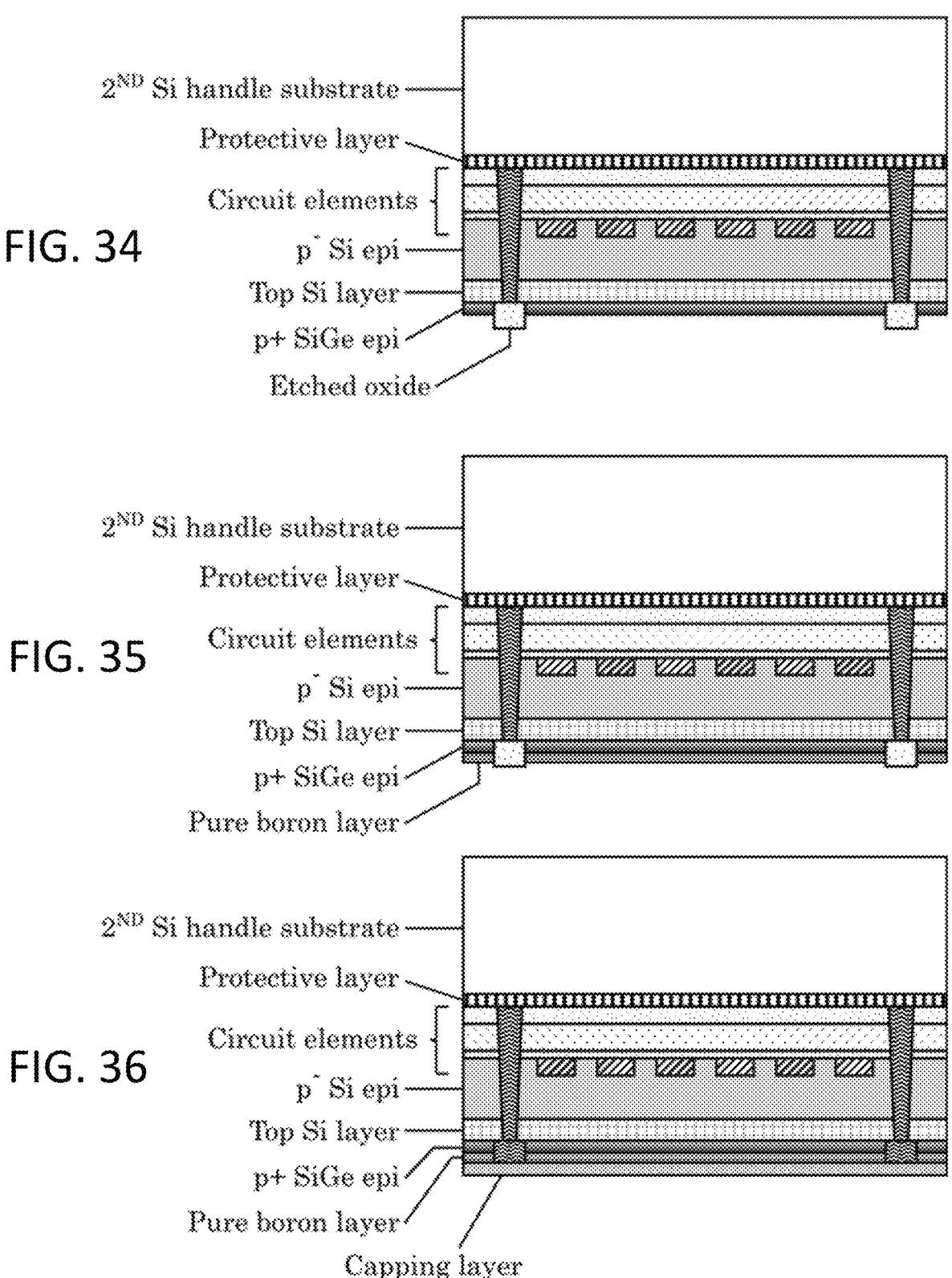

FIGS. 30-36 show a flow diagram of cross-sectional side views of another exemplary process to fabricate an image sensor on an SOI substrate employing full wafer thinning. As shown in FIG. 30, an oxide layer is included between the silicon substrate and the top silicon layer. A second silicon handle substrate is disposed on a protective layer on the circuit elements of the front side in FIG. 32. The oxide is etched to form regions near the blind vias in FIG. 33. The p+ SiGe layer is applied between the etched oxide in FIG. 34. A boron layer is applied to the p+ SiGe layer in FIG. 35, which can occur between the etched oxide. A capping layer (e.g., an anti-reflective coating) is applied to the boron layer in FIG. 36.

The thicknesses, processing temperatures, and other parameters described in FIGS. 1-6 can be applied to the embodiments of FIGS. 10-16, FIGS. 17-23, FIGS. 24-29, and FIGS. 30-36.

In an embodiment, all or nearly all of the silicon substrate is thinned. All SiGe and boron processes can be performed at less than 450° C. A metal process can be completed prior to the thinning.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. An image sensor comprising:
a p-type silicon layer;

a silicon layer disposed on the p-type silicon layer;
a p-type SiGe layer disposed on the p-type silicon layer;
a boron layer disposed on the p-type SiGe layer; and
an anti-reflective coating disposed on the boron layer.

2. The image sensor of claim 1, further comprising a polysilicon layer disposed on a side of the p-type silicon layer opposite of the silicon layer.

3. The image sensor of claim 1, further comprising a metal layer disposed on the polysilicon layer.

4. The image sensor of claim 1, wherein the p-type SiGe layer is a contiguous layer.

5. The image sensor of claim 1, wherein the boron layer is a contiguous layer.

6. The image sensor of claim 1, wherein the p-type SiGe layer has a thickness from 20-50 nm.

7. The image sensor of claim 1, wherein the boron layer has a thickness from 2-20 nm.

8. The image sensor of claim 1, wherein the p-type SiGe layer is disposed directly on the p-type silicon layer and the silicon layer.

9. The image sensor of claim 1, wherein the boron layer is disposed directly on the p-type SiGe layer.

10. The image sensor of claim 1, wherein the silicon layer defines a trench that exposes the p-type silicon layer at a bottom of the trench, wherein the p-type SiGe layer is disposed on the bottom of the trench such that the p-type SiGe layer is disposed on the p-type silicon layer and on the silicon layer that forms the trench, and wherein the boron layer is disposed on the p-type SiGe layer in the trench.

11. The image sensor of claim 1, further comprising a second silicon handle substrate disposed on the p-type silicon layer opposite the p-type SiGe layer.

12. The image sensor of claim 1, further comprising an oxide layer disposed between the p-type silicon layer and the silicon layer.

13. An inspection system that includes the image sensor of claim 1.

14. A method of fabricating an image sensor comprising:
forming a p-type silicon layer on a silicon layer;
forming a p-type SiGe layer on the p-type silicon layer;
coating the p-type SiGe layer with a boron layer; and
forming an anti-reflective coating on the boron layer.

15. The method of claim 14, further comprising forming a polysilicon layer on a side of the p-type silicon layer opposite of the silicon layer.

16. The method of claim 15, further comprising performing a metallization process thereby adding a metal layer on the polysilicon layer.

17. The method of claim 14, wherein the p-type silicon layer or the p-type SiGe layer is formed using epitaxial growth.

18. The method of claim 14, further comprising an annealing step after the boron layer is formed whereby boron from the boron layer is driven into the p-type SiGe layer.

19. The method of claim 18, wherein the annealing step is from 450° C. to 950° C.

20. The method of claim 14, further comprising etching a trench in the silicon layer, wherein the trench exposes the p-type silicon layer at a bottom of the trench, and wherein the p-type SiGe layer is disposed on the p-type silicon layer at the bottom of the trench and on the silicon layer forming sidewalls of the trench.

* * * * *